US009300339B2

(12) United States Patent  
Luo et al.

(10) Patent No.: US 9,300,339 B2  
(45) Date of Patent: Mar. 29, 2016

(54) WIRELESS HANDLE FOR A BATTERY TESTER AND BATTERY TESTER ASSEMBLY THEREOF

(71) Applicant: Danaher (Shanghai) Industrial Instrumentation Technologies R&D Co., Ltd., Shanghai (CN)

(72) Inventors: Shounan Luo, Shanghai (CN); Junlong Sheng, Shanghai (CN); Tao Zhong, Shanghai (CN)

(73) Assignee: Danaher (Shanghai) Industrial Instrumentation Technologies R&D Co., Ltd., Shanghai (CN)

( * ) Notice: Subject to any disclaimer, the term of this patent is extended or adjusted under 35 U.S.C. 154(b) by 297 days.

(21) Appl. No.: 13/926,982

(22) Filed: Jun. 25, 2013

(65) Prior Publication Data

US 2014/0070813 A1 Mar. 13, 2014

(30) Foreign Application Priority Data

Sep. 11, 2012 (CN) .......................... 2012 1 0335068

(51) Int. Cl.
| | |
|---|---|
| *G01N 27/416* | (2006.01) |
| *H04B 1/38* | (2015.01) |
| *G01R 31/36* | (2006.01) |
| *G01K 13/00* | (2006.01) |

(52) U.S. Cl.
CPC *H04B 1/38* (2013.01); *G01K 13/00* (2013.01); *G01R 31/3606* (2013.01); *G01R 31/3627* (2013.01); *G01R 31/3689* (2013.01)

(58) Field of Classification Search
CPC ....... H04B 1/38; G01R 31/3606; G01K 13/00
USPC ......................................................... 324/426
See application file for complete search history.

(56) References Cited

U.S. PATENT DOCUMENTS

| | | | |
|---|---|---|---|
| 6,225,808 B1 | 5/2001 | Varghese | |
| 6,469,511 B1 | 10/2002 | Vonderhaar | |
| 6,919,725 B2 | 7/2005 | Bertness | |
| 7,312,603 B2* | 12/2007 | Luo et al. | 324/127 |
| 7,425,833 B2 | 9/2008 | Bertness | |
| 7,977,914 B2 | 7/2011 | Bertness | |
| 2003/0206021 A1* | 11/2003 | Laletin et al. | 324/426 |

(Continued)

OTHER PUBLICATIONS

European Search Report dated Jun. 28, 2013, in European Patent Application No. 13 16 5174.7 filed Apr. 24, 2013, 6 pages.

*Primary Examiner* — M'Baye Diao  
(74) *Attorney, Agent, or Firm* — Seep IP Law Group PLLC (57) ABSTRACT

A wireless handle for a battery tester, comprising a wireless signal transmitting/receiving means capable of exchanging information with a battery tester through wireless communication; an information input means; an information output means; and a signal processing and control means, wherein the wireless signal transmitting/receiving means, the information input means, and the information output means are coupled with the signal processing and control means. The wireless handle enables an operator to control some functions of the battery tester and/or monitor detected information remotely during the process of testing, which can increase efficiency of the testing and avoid any disturbance of the testing circuits caused by the information input means and the information output means.

30 Claims, 7 Drawing Sheets

(56) References Cited

U.S. PATENT DOCUMENTS

| | | |
|---|---|---|
| 2005/0149280 A1 | 7/2005 | Sharma |
| 2005/0162172 A1 | 7/2005 | Bertness |
| 2005/0206346 A1 | 9/2005 | Smith |
| 2007/0013507 A1 | 1/2007 | Sparacino |
| 2013/0093447 A1* | 4/2013 | Nickel et al. ............. 324/750.16 |
| 2013/0231046 A1* | 9/2013 | Pope et al. ................... 455/41.1 |

* cited by examiner

WIRELESS HANDLE FOR A BATTERY TESTER AND BATTERY TESTER ASSEMBLY THEREOF

TECHNICAL FIELD

The present application relates to battery testing, particularly, to a wireless handle for a battery tester and a battery tester assembly thereof.

BACKGROUND

Figure 1:
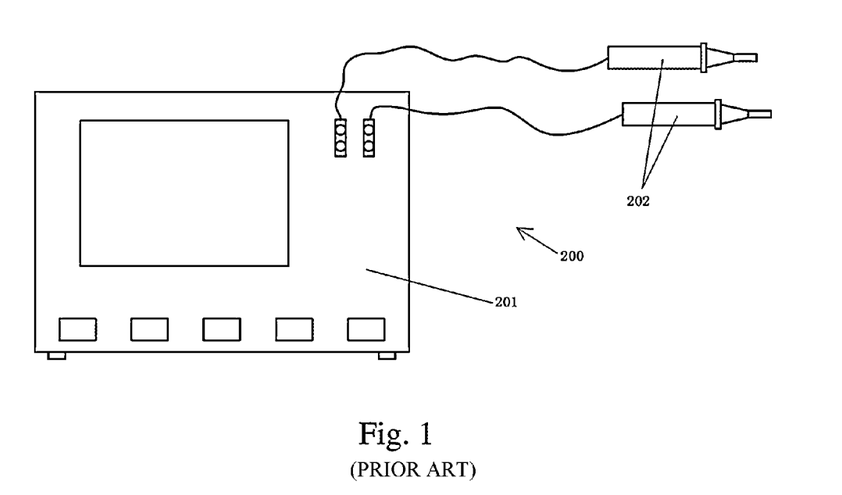
FIG. 1 shows an illustrative view of a battery tester according to conventional technology.

Storage batteries have been widely used as a backup power source in many fields, such as industrial manufacturing, transportation, communication, etc. It is necessary to check and maintain storage batteries regularly to avoid problems that might be caused due to failure or insufficient capacity of the storage batteries. As shown in FIG. 1, a conventional battery tester 200 generally includes a main body 201 and a pair of test leads 202 coupleable to the main body 201. When measuring parameters of a battery or a battery pack with such a battery tester, an operator needs to first operate the main body to set suitable testing mode and measuring conditions. After the testing mode and measuring conditions are set, the operator can press a start key, and then hold a test lead in each hand to make the test leads contact with the anode and the cathode of the battery or the battery pack to be tested, respectively. The main body of the battery tester can process the electrical signals from the test leads to obtain testing results, show the results on a display on the main body, and/or store the results in the memory of the main body. Since the main body usually has a relatively large size and weight, it is often put in a fixed place during the testing. If the operator wants to change the testing mode or some testing conditions during the testing, he or she may need to return to and operate the main body, or ask someone else to operate the main body, which may significantly reduce efficiency. In addition, the operator may need to turn around to check the testing results shown on the display of the main body, which is quite inconvenient for the operator.

In order to overcome the shortcomings mentioned above, an enhanced test lead, which includes a display for showing the test information and a button or buttons for controlling some functions of the battery tester, has been made. In such a test lead, the display, the button(s), and the test terminal share the electrical circuit for exchanging information with the main body of the battery tester. Due to the common circuit shared by the display, the button(s), and the testing terminal, the test lead has a large size and complicated circuit. Furthermore, the wire communication between the display/button(s) and the main body is realized by a signal having a frequency close to that of the current flowing through the testing circuit, so the wire communication between the display/button(s) and the main body may interfere with the measurement and thereby reduce its accuracy.

SUMMARY

The present application relates to a wireless handle for a battery tester comprising a wireless signal transmitting/receiving means capable of exchanging information with a battery tester through wireless communication; an information input means; an information output means; and a signal processing and control means, wherein the wireless signal transmitting/receiving means, the information input means, and the information output means are coupled with the signal processing and control means.

According to one aspect of the present application, the wireless signal transmitting/receiving means transmits and/or receives radio frequency signals.

According to another aspect of the present application, the wireless signal transmitting/receiving means applies one or more of the following wireless communication technologies: Bluetooth, Wi-Fi, ZIGBEE, and Near Field Communication.

According to another aspect of the present application, the radio frequency signals have a frequency of 2.4 GHz.

According to another aspect of the present application, the wireless handle has a streamline-like shape tapering off gradually from its proximal end to its distal end or a rod-like shape with a substantially rectangular or circular cross section.

According to another aspect of the present application, the wireless handle further comprises a mounting means on its distal end for detachably mounting a test lead of the batter tester onto the wireless handle.

According to another aspect of the present application, the mounting means is configured as a threaded hole having a side opening or a threaded flange having a side opening.

According to another aspect of the present application, the mounting means is configured as a clip for clamping the test lead of the battery tester.

According to another aspect of the present application, the wireless handle further comprises at least one wire accommodating means for detachably accommodating the wire extending from the test lead.

According to another aspect of the present application, the at least one wire accommodating means is configured as a groove extending along the peripheral surface of the wireless handle or a plurality of wire clips arranged on the outside of the wireless handle.

According to another aspect of the present application, the information output means includes a display.

According to another aspect of the present application, the display is positioned on the proximal end of the wireless handle.

According to another aspect of the present application, there is an angle between the display and the longitudinal axial direction of the wireless handle.

According to another aspect of the present application, the angle between the display and the longitudinal axial direction of the wireless handle is between 30° and 60°.

According to another aspect of the present application, the display is an LCD display, an LED display, an OLED display, a plasma display, or an E-ink display.

According to another aspect of the present application, the information output means includes a speaker.

According to another aspect of the present application, the information output means includes at least one indicator.

According to another aspect of the present application, the at least one indicator is arranged on or around the proximal end of the wireless handle.

According to another aspect of the present application, the at least one indicator can indicate at least one state of a battery to be tested.

According to another aspect of the present application, the information input means includes at least one input key.

According to another aspect of the present application, there is at least one input key positioned around the proximal end of the wireless handle in such a manner that an operator of the wireless handle can operate the at least one input key with his fingers while gripping the wireless handle.

According to another aspect of the present application, the wireless handle further comprises a non-contact temperature sensor for testing the temperature of a battery to be tested.

According to another aspect of the present application, the non-contact temperature sensor is positioned on or around the distal end of the wireless handle.

According to another aspect of the present application, the wireless handle further comprises a power supply means.

According to another aspect of the present application, the power supply means is a battery placed inside the wireless handle.

According to another aspect of the present application, the wireless handle further comprises a light positioned on or around the distal end of the wireless handle, and the power supply means supplies power to the light.

According to another aspect of the present application, a battery tester assembly is provided comprising a battery tester including a main body and at least a pair of test leads capable of coupling to the main body, wherein the main body comprises a wireless signal transmitting/receiving module; and a wireless handle, which comprises a wireless signal transmitting/receiving means that can establish a wireless communication with the wireless signal transmitting/receiving module of the main body so that the wireless handle can exchange information with the battery tester through wireless communication.

According to the present application, the wireless handle can exchange information with a battery tester through wireless communication, and it has a separate power supply means. The information input means and the information output means are powered by the separate power supply means to exchange information with the main body of the battery tester through wireless communication therebetween. Therefore, they do not share a common electrical circuit with the testing terminal of a test lead, which reduces the size of the test lead and simplifies its internal structure accordingly. Moreover, the wireless handle exchanges information with the main body of the battery tester through wireless communication therebetween, which uses signals having a frequency quite different from the frequency of the current flowing through the testing circuit. Thus the wireless communication would not affect the accuracy of the testing.

DESCRIPTION OF THE DRAWINGS

The foregoing and other features of the present application will become more fully appreciated from the following description and appended claims, taken in conjunction with the accompanying drawings. It will be readily understood that the aspects of the present disclosure, as generally described herein and illustrated in the drawings, could be arranged and designed in a wide variety of different configurations. Thus, the following more detailed description, as represented in the drawings, is not intended to limit the scope of the invention as claimed, but be merely representative of presently preferred embodiments of the invention. In the drawings, the components illustrated are not necessarily made to scale, and similar symbols typically identify similar components, unless context dictates otherwise.

DETAILED DESCRIPTION

In the following detailed description, reference is made to the accompanying drawings, which form a part hereof. The illustrative examples described in the detailed description, drawings, and claims are not meant to be limiting. Other examples may be utilized, and other changes may be made, without departing from the spirit or scope of the subject matter presented herein. It will be readily understood that the aspects of the present application, as described herein, and illustrated in the drawings, can be arranged, substituted, combined, separated, and designed in a wide variety of different configurations, all of which are implicitly contemplated herein.

For the purpose of clear description, some special terms will be applied herein to describe the special embodiments. However, these terms are not intended to be limiting. Instead, these terms shall be understood broadly to cover any and all equivalents achieving similar objectives by applying similar means.

In the present application, the term "couple" or "coupling" shall be understood as broadly as possible to cover both direct connection and indirect connection, and the means for coupling may be wired or wireless. The term "proximal end of the wireless handle" refers to the end of the wireless handle that is proximal to the operator in a normal operation state. The term "distal end of the wireless handle" refers to the end of the wireless handle that is distal to the operator in the normal operation state.

Figure 2:
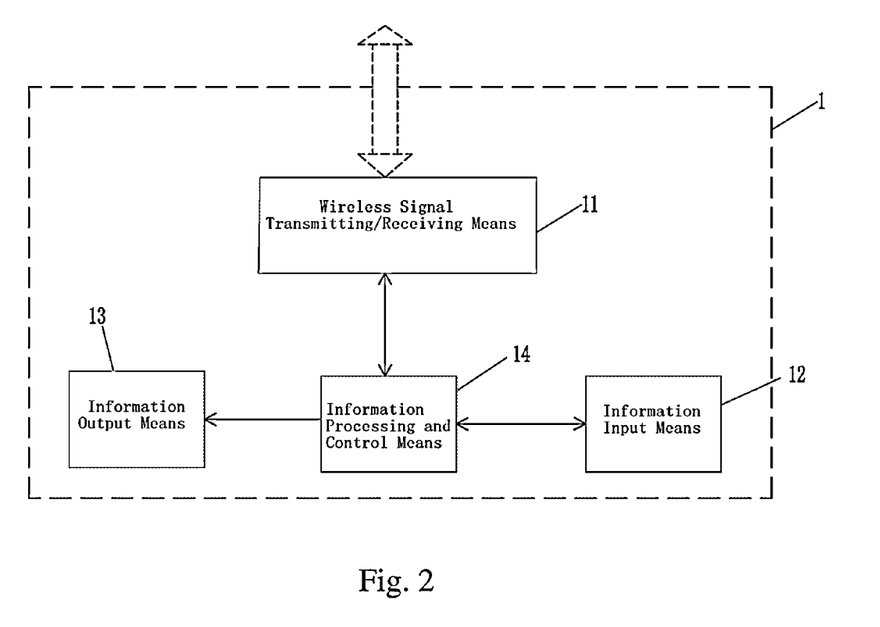
FIG. 2 shows a functional diagram of a wireless handle according to the present application.

As shown in FIG. 2, the wireless handle 1 according to at least one embodiment of the present application comprises a wireless signal transmitting/receiving means 11, an information input means 12, a signal processing and control means 14, an information output means 13, and a power supply means (not shown). The wireless signal transmitting/receiving means 11 can exchange information with the battery tester 2 having a wireless signal transmitting/receiving module 221 by means of wireless communication. The wireless signal transmitting/receiving means 11 can use wireless signals, such as RF signals and other signals capable of achieving wireless communication. When using RF signals, wireless RF communication technology using little transmission power and applicable for near distance transmission, such as Bluetooth, Wireless Fidelity (Wi-Fi), ZIGBEE, Near Field Communication (NFC), and the like, can be applied so as to reduce power consumption of the wireless signal transmitting/receiving means 11 and prevent public wireless communication networks (e.g., wireless data communication network and GSM network) from interfering with the wireless communication between the wireless handle 1 and the battery tester 2. In an embodiment of the present application, 2.4 GHz ZIGBEE is applied as the wireless communication protocol.

The information input means 12 is used to input information including operation command, parameters, and etc. Information inputted via the information input means 12 is processed by the signal processing and control means 14. The processed information is further transmitted to the main body 22 of the battery tester 2 by the wireless signal transmitting/receiving means 11 for storage, or for further analysis and process by the main body 22 to control the operation modules of the main body 22 (for example, the data storage module).

The information output means 13 is used to output information. Information outputted by the information output means 13 may come from the main body 22 of the battery tester 2 or from the wireless handle 1. Such information may include, for example, ID code, resistance, voltage, discharge current, temperature, and status of the battery to be tested, commands, states of the tester, and the like.

The signal processing and control means 14 is coupled to the wireless signal transmitting/receiving means 11, the information input means 12 and the information output means 13, respectively, so as to process signals from these units and/or control these units.

The power supply means provides electricity to the wireless signal transmitting/receiving means 11, the information input means 12, the information output means 13, the signal processing and control means 14 and other electrical components of the wireless handle. The power supply means may be configured as a battery or batteries inside the wireless handle 1 (see the battery 15 as shown in FIG. 3) or as a power supply interface coupleable to a power source, wherein the battery or batteries may, for example, be all kinds of chargeable batteries, dry batteries, and etc.

Figure 3:
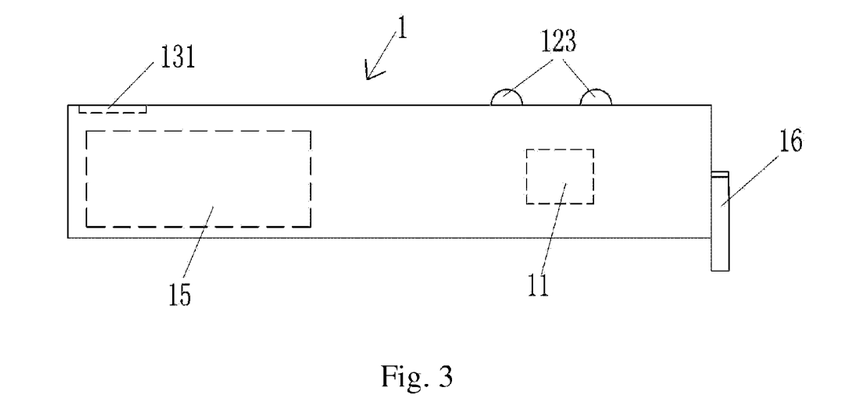
FIG. 3 shows an illustrative structural view of a wireless handle according to a first embodiment of the present application.
Figure 4:
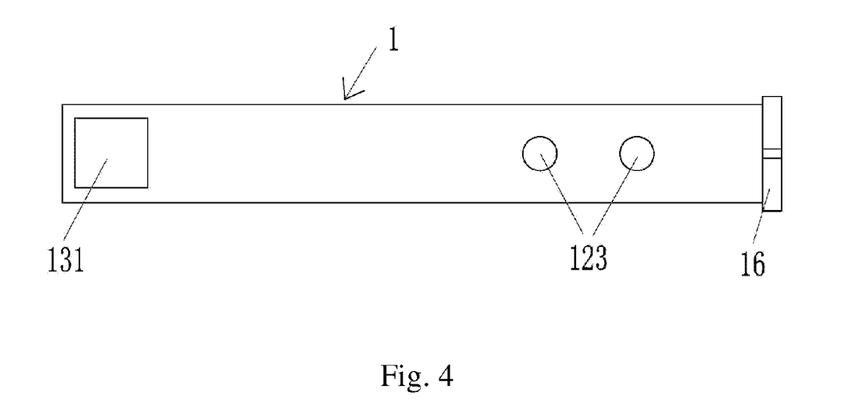
FIG. 4 shows the top view of the wireless handle of FIG. 3.
Figure 5:
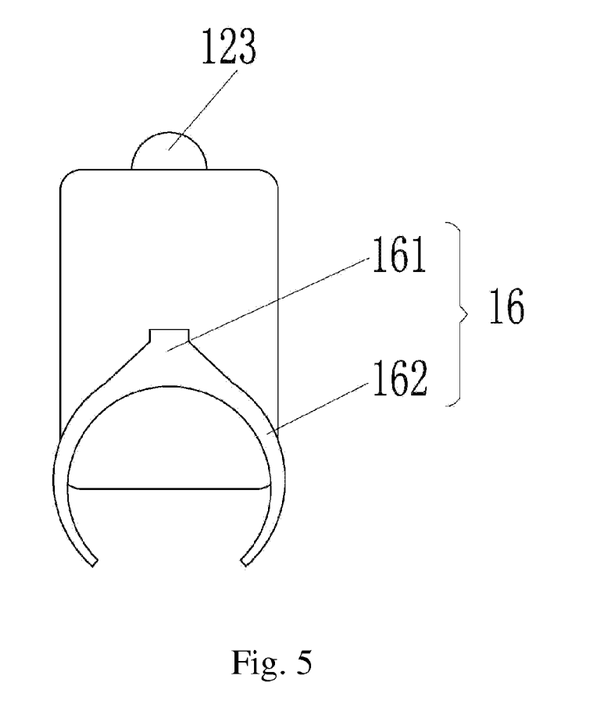
FIG. 5 shows the right view of the wireless handle of FIG. 3.

FIGS. 3-5 show the configurations of the wireless handle 1 according to a first embodiment of the present application. As shown in FIG. 3, the wireless handle 1 is formed as an elongated rod with a substantially rectangular cross section for facilitating operator's one-hand holding and operation. A display 131 (an example of the information output means) and input buttons 123 (an example of the information input means) are positioned facing upward on the peripheral surface of the wireless handle 1.

The display 131 is positioned near the proximal end of the wireless handle 1 and has a configuration suitable to be mounted onto the wireless handle 1. The display 131 may be selected from the group consisting of liquid crystal display (LCD), LED display, OLED display, plasma display, or electronic ink (E-ink) display.

Input buttons 123 are provided near the distal end of the wireless handle 1. For example, the input buttons 123 may include a start button and a storage button. In this embodiment, the input buttons 123 are configured as pressing buttons protruding from the peripheral surface of the wireless handle 1. However, it is apparent that the buttons may have various configurations, for example, as sliding button, rotational button, film button, touch display, and other real or virtual input means.

The distal end of the wireless handle 1 is further provided with a mounting means 16 for mounting a test lead thereon. As shown in FIG. 5, the mounting means 16 is configured as an elastic C-shaped clip comprising a base 161 and two clip arms 162 extending from both sides of the base 161. The base 161 may be formed as an integral part of the wireless handle 1 or be fixed onto the distal end of the wireless handle 1 through welding, adhesion, screw, and other suitable mechanical connection means. When the test lead is mounted between the clip arms 162, the clip arms 162 can grip the test lead by force caused through elastic deformation and thereby holding the test lead near the distal end of the wireless handle 1. The mounting means 16 may also be configured otherwise so as to hold the test lead by means of clamping, screw, and etc. The battery 15 (the power supply means) and the wireless signal transmitting/receiving means 11 for transmitting and receiving wireless signals are provided inside the wireless handle 1.

To obtain parameters of a battery, the operator may mount a test lead (not shown) that is plugged into a battery tester onto the mounting means 16 on the distal end of the wireless handle 1. When ready for measuring, the operator may hold the wireless handle 1 in hand and press the start button 123 to activate the wireless handle 1. Wireless communication between the wireless signal transmitting/receiving means 11 and the battery tester is then established. Information inputted or measured by the wireless handle is sent to the battery tester to be processed. The battery tester then sends information measured from the battery, such as internal resistance and voltage of the battery, to the wireless signal transmitting/receiving means 11. After being processed by the signal processing and control means 14, information from the battery tester is displayed on the display 131. If the operator confirms completeness of a test based on the information shown on the display 131, he or she may press the storage button 123. The command that is input is first processed by the information processing and control means 14, and then sent to the main body of the battery tester by the wireless signal transmitting/receiving means 11 to instruct the main body to store the information measured. Next, the operator may repeat the process until all batteries are tested. At the end of the testing, the operator may press the start button once more to switch off the wireless handle 1 and terminate wireless communication between the wireless handle 1 and the battery tester. Obviously, the storage button can be omitted so that only one start button is provided on the wireless handle 1.

Figure 6:
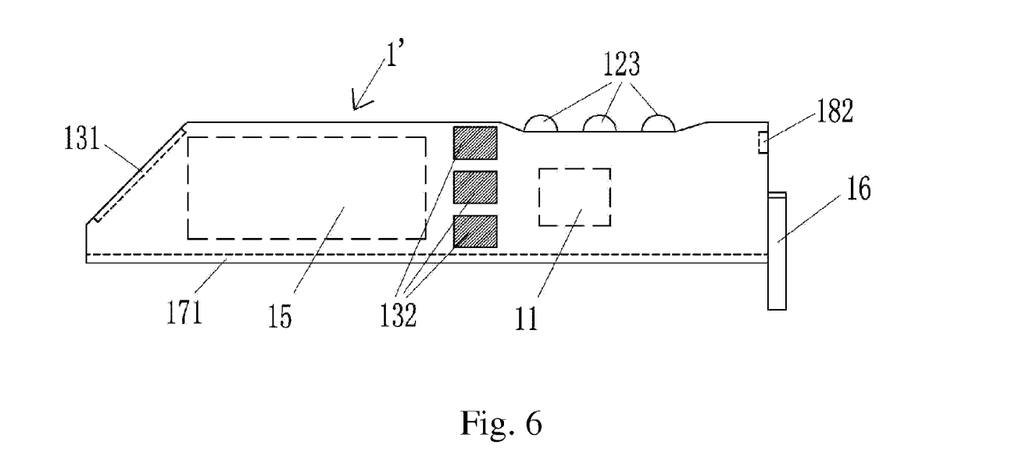
FIG. 6 shows an illustrative structural view of a wireless handle according to a second embodiment of the present application.
Figure 7:
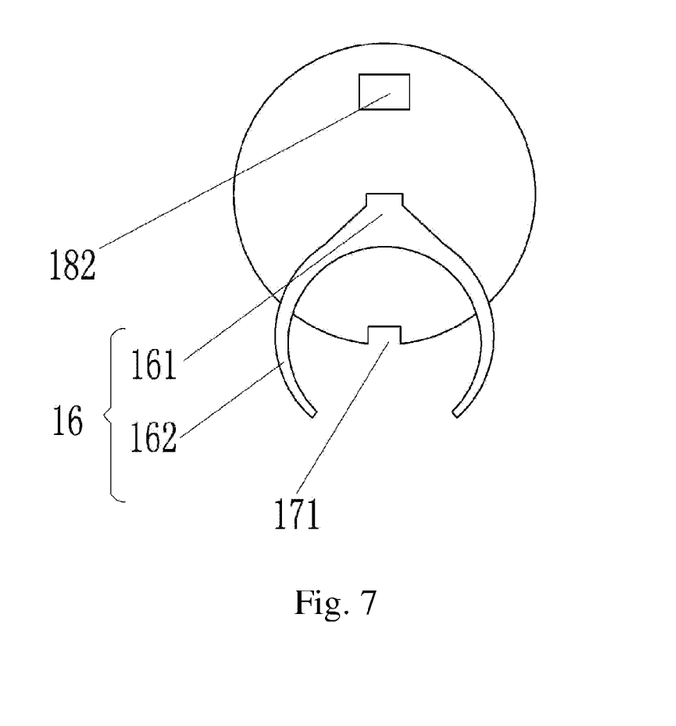
FIG. 7 shows the right view of the wireless handle of FIG. 6.

FIGS. 6 and 7 show a schematic configuration of a wireless handle 1' according to a second embodiment of the present application. Unless indicated otherwise, the wireless handle 1' has the same parts as the first embodiment.

As shown in FIGS. 6 and 7, the wireless handle 1' is also configured as a rod, but has a substantially circular cross section. The display 131 is provided on the peripheral surface of the wireless handle 1' close to the proximal end (the left side shown in FIG. 6), forming an angle with the axial direction of the wireless handle 1'. With such a configuration, the operator can easily see information shown on the display 131 while holding the wireless handle 1' for measurement. The angle between the display 131 and the axial direction of the wireless handle 1' may vary from 30 degrees to 60 degrees. In one embodiment of the present application, the angle between the display 131 and the longitudinal axial direction of the wireless handle 1' is about 45 degrees. In another embodiment, the angle between the display 131 and the longitudinal axial direction of the wireless handle 1' is 60 degrees.

As shown in FIG. 6, along the axial direction of the wireless handle 1', three indicators 132 are provided in the middle of the peripheral surface of the wireless handle 1'. The three indicators 132 may display different colors, such as red, yellow, and green. When the main body of the battery tester determines that the resistance of the battery measured is higher than a pre-determined failure value, it sends a signal to the wireless handle 1' to switch on the red indicator 132. In particular, the signal is first processed by the information processing and control means 14, and is then used to switch on the red indicator 132 to indicate the state of "failure" and remind the operator to replace the battery. When the internal resistance of the battery is between a pre-determined warning value and the failure value, the battery tester sends a signal to the wireless handle 1' to switch on the yellow indicator 132 to indicate the state of "warning" and remind the operator to check the battery more frequently. When the internal resistance of the battery is below the warning value, the battery tester sends a signal to the wireless handle 1' to switch on the green indicator 132 to indicate the state of "normal," meaning that the battery is working normally. Output of information about the states of the battery by the wireless handle 1' is thereby realized by switching on different indicators 132. Obviously, a single indicator 132 can also be used to indicate a state of battery such as the state of "failure." Of course, to satisfy different practical requirements, it is possible to determine the states of the battery based on other parameters, or indicate other information by switching on different indicators 132 (e.g., information on whether the temperature of the battery is too high or too low).

A non-contact temperature sensor 182 for detecting temperature of a battery is provided on the distal end of the wireless handle 1', specifically, on the distal end surface of the wireless handle 1'. Signal indicating temperature detected is processed by the information processing and control means 14 and then displayed directly on the display 131. At the same time, the wireless signal transmitting/receiving means 11 can send the temperature data to the battery tester for storage and further process. The wireless handle 1' may also be provided with an input button 123 to control the temperature sensor 182.

Furthermore, a wire accommodating means may be provided on the outside of the wireless handle 1' to detachably accommodate wires extending from the test leads. In one embodiment, the wire accommodating means is configured as a groove extending along the peripheral surface of the wireless handle 1'. The groove 171 is located along the side and extends to both ends of the wireless handle 1'. The groove 171 has a size for tightly fitting with the wires inserted into the groove 171 to detachably accommodate the wires in the groove 171.

Figure 8:
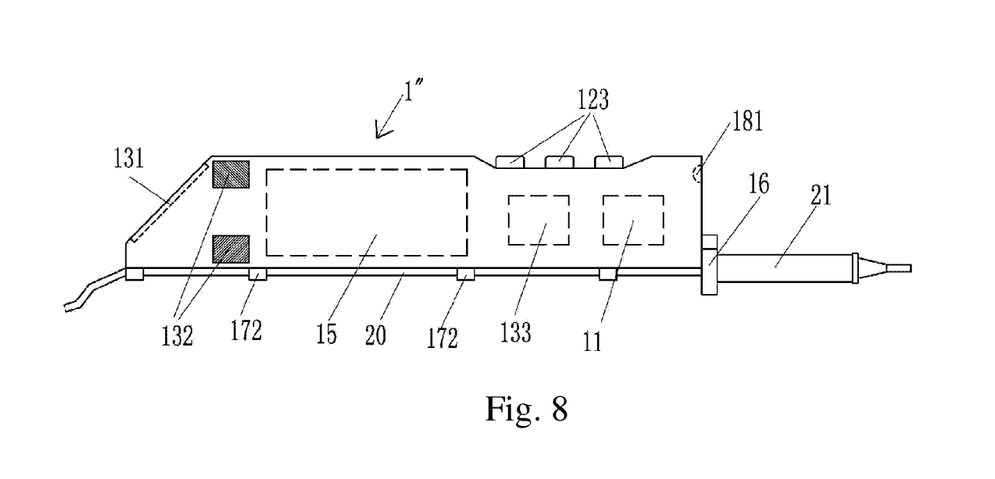
FIG. 8 shows an illustrative structural view of a wireless handle according to a third embodiment of the present application.

FIG. 8 shows an illustrative structural view of a wireless handle 1" according to a third embodiment of the present application. As shown in FIG. 8, indicators 132 are provided on the peripheral surface of the wireless handle 1" and near the proximal end. There are two indicators 132 shown in FIG. 8, and these indicators 132 may display the same or different colors. Different information may be indicated by switching on one indicator 132 or two indicators 132 at one time. For example, switching on one indicator 132 indicates the state of "failure," switching on the other indicator 132 indicates the state of "normal," and switching on both indicators 132 indicates the state of "warning." Apparently, states of the battery, such as "normal" and "failure," may also be indicated by means of color or flashing times of one or more indicators. Of course, more information can be outputted by increasing the number of indicators (e.g., three, four, or more indicators) and/or changing the colors and combinations of the indicators being switched on.

The distal end, more specifically, the distal end surface of the wireless handle 1" is provided with a light 181. The light 181 is powered by the battery 15 to illuminate dark area around the battery to be tested for facilitating testing by the operator.

Inside the wireless handle 1", a speaker 133 is also provided as an example of information output means 13. The speaker 133 can output information by means of sound or voice. For example, the speaker 133 may report parameters measured and/or location of the battery to be tested, and alert any potential failure of the battery being tested.

In addition, as shown in FIG. 8, the wire accommodating means comprises a plurality of wire clips 172 arranged outside of the wireless handle 1" and spaced apart from each other. The wire 20 extending from the test lead 21 can be accommodated in the clips 172 so that the wire 20 extends along the surface of the wireless handle 1" and will not interfere with the testing. The term "outside of the wireless handle" herein means being positioned on or near the external surface of the wireless handle, for example, being positioned on the outer surface of the wireless handle. In one illustrative embodiment, the wire clips 172 near the distal end of the wireless handle 1" and the mounting means 16 can be positioned on the same side with respect to the longitudinal axial direction of the wireless handle 1". Although four wire clips 172 are shown in the drawings, it is obvious to a person skilled in the art that the number of wire clips can be changed (e.g., two, three, four, five, and so on) to secure the wire on the peripheral surface of the wireless handle. Moreover, the positions of the wire clips can be adjusted to be arranged in a straight line, an oblique line, a spiral line and etc.

Figure 9:
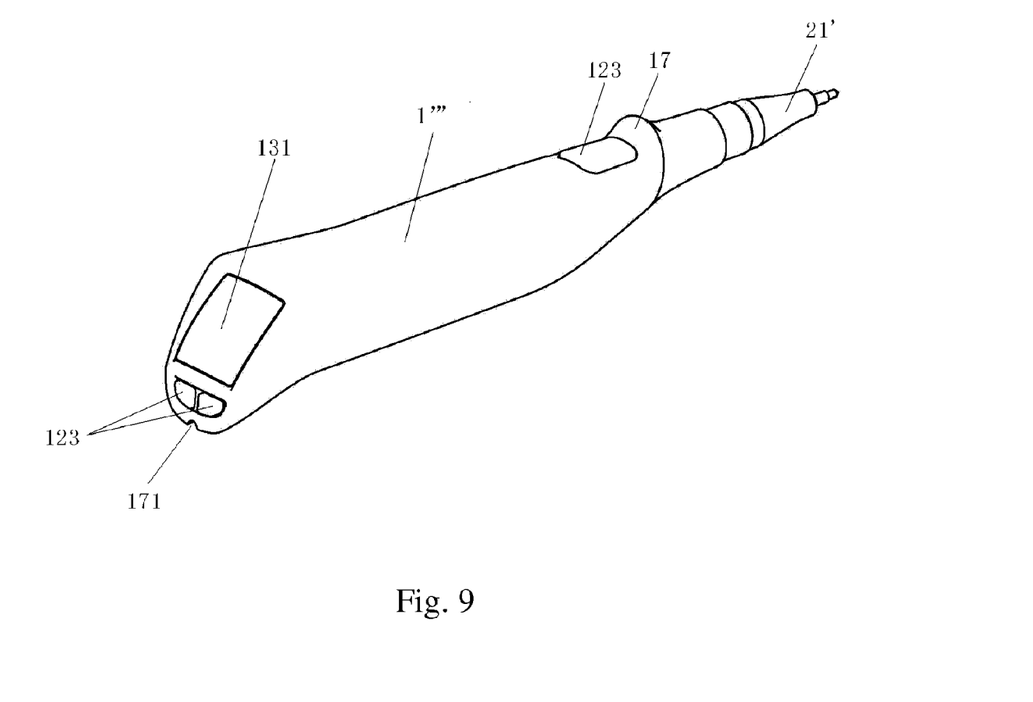
FIG. 9 shows a perspective view of a wireless handle according to a fourth embodiment of the present application in a state of being connected with a test lead.
Figure 10:
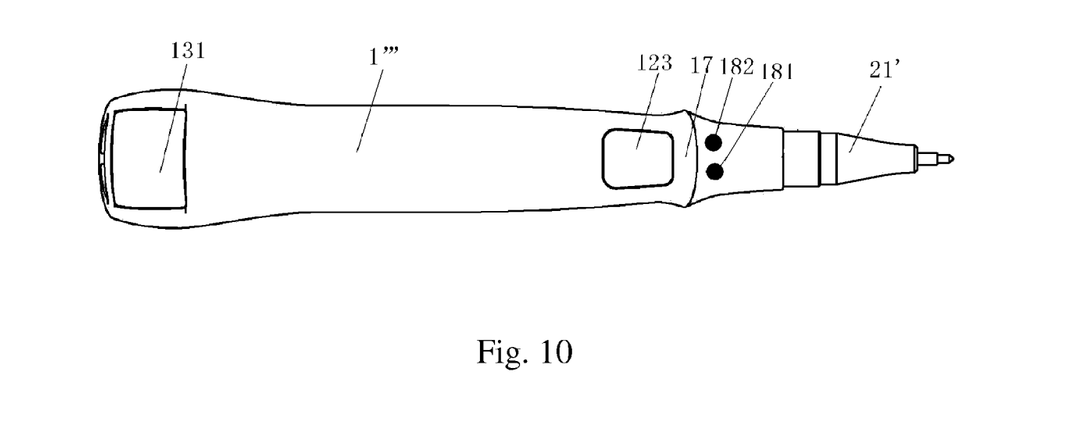
FIG. 10 shows the top view of the wireless handle of FIG. 9.
Figure 11:
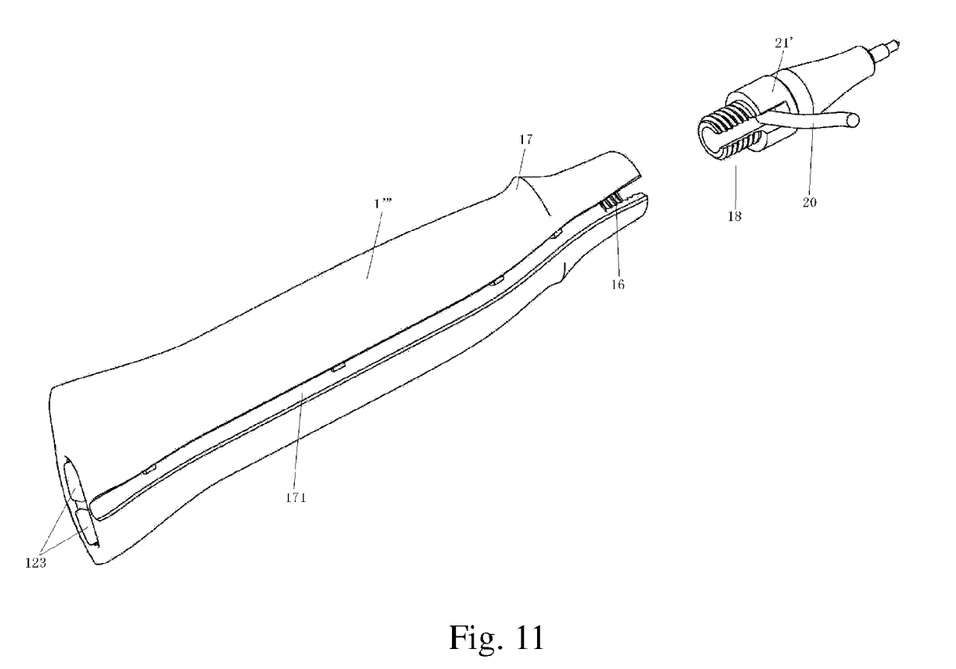
FIG. 11 shows an exploded view of a wireless handle and a test lead of the present application.

FIGS. 9-11 show the structure of a wireless handle 1''' according to a fourth embodiment of the present application, with a test lead 21' attached on the wireless handle 1'''. As shown in FIGS. 9 and 10, the wireless handle 1''' has a streamline-like shape tapering off gradually from its proximal end to its distal end. A barrier 17 is provided in the transition area between the middle and the distal end of the wireless handle 1''' to prevent the hand of the operator from reaching the distal end and to help the operator to be aware of the position of holding. The structure shown in FIGS. 9-11 makes it possible for the operator to choose the way of holding the wireless handle according to his or her habit. In other words, the operator may either hold at the middle of the wireless handle 1''' with his or her palm (the rod-like grip), or hold the tapered portion of the wireless handle 1''' close to the barrier 17 with his or her fingers (the pen-like grip).

Input buttons 123 are provided on the proximal end surface and the peripheral surface close to the distal end of the wireless handle 1''', respectively. With such an arrangement, the operator may operate the input buttons 123 with his fingers while holding the wireless handle 1''' under the state of rod-like grip.

The display 131 is provided at the proximal end of the wireless handle 1''' with indicators (not shown) provided around the display 131, so that the operator can see the display 131 and the indicators easily. A light 181 and a temperature sensor 182 are provided at the distal side of the barrier 17.

As shown in FIG. 11, the test lead 21' is mounted onto the wireless handle 1''' through a screw. Particularly, the mounting means 16 is configured as a threaded hole having a lateral opening, with the groove 171 for accommodating wire extending to and aligning with the lateral opening. The end of the test lead 21' to be engaged with the mounting means 16 is configured as a flange having a male thread. To mount the test lead 21' onto the mounting means 16, the wire 20 extending from the test lead 21' needs to be drawn outside of the sidewall of the test lead 21' through the lateral opening of the flange 18. Next, the threaded portion of the flange 18 is engaged into the threaded hole 16, and the lateral opening of the flange 18 is in substantial alignment with the lateral opening of the threaded hole 16. Finally, the wire 20 is pressed into the groove 171 to complete the mounting of the test lead 21' and the accommodation of the wire 20. Additionally, the wireless handle 1''' can be provided with a wire groove cover made of elastic materials to cover the groove 171 after the accommodation of the wire 20 in the groove 171. The flange and threaded hole can also be provided reversely, i.e., the mounting means 16 is configured as a flange having a lateral opening and male thread, and the end of the test lead 21 to be engaged with the mounting means 16 is configured as a threaded hole having a lateral opening.

Figure 12:
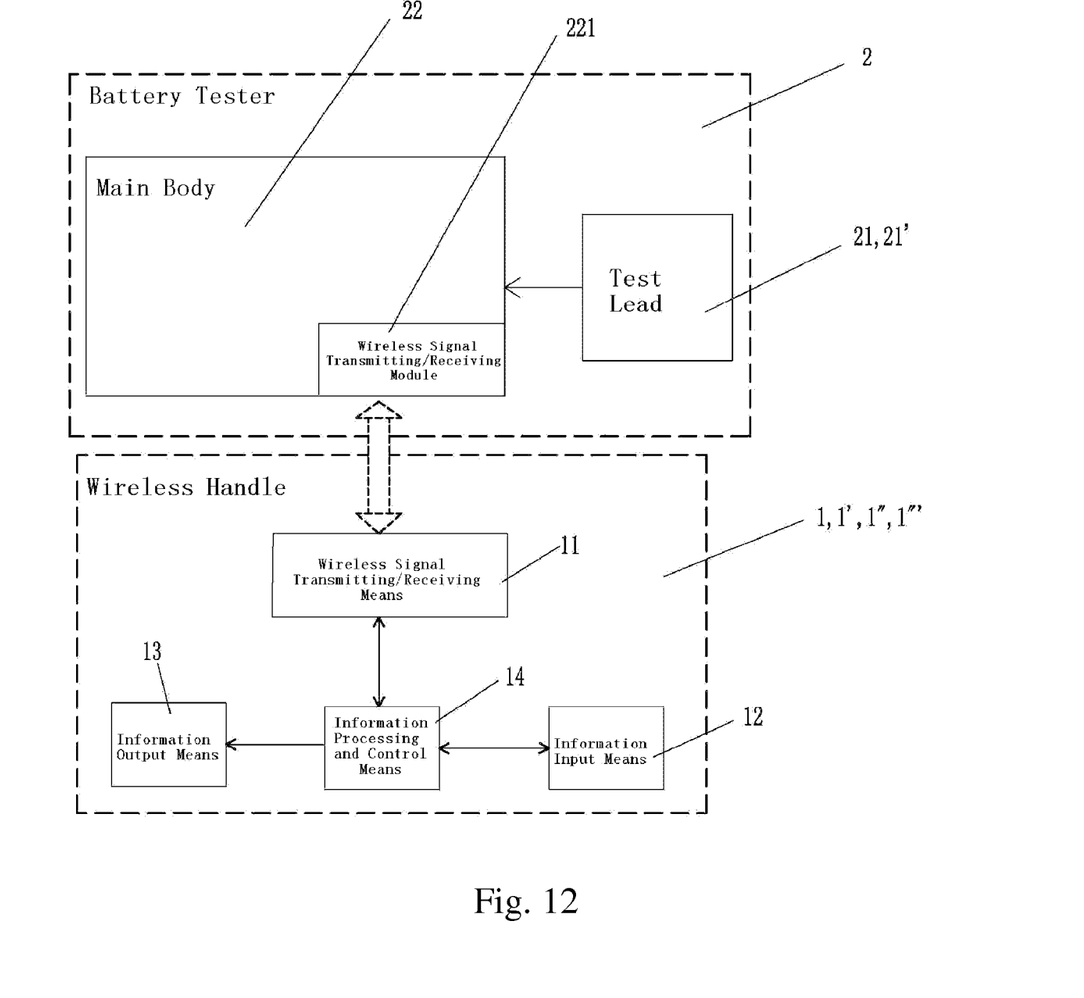
FIG. 12 shows a functional diagram of a battery tester assembly according to the present application.

FIG. 12 is a functional diagram showing a battery tester assembly according to the present application. As shown in FIG. 12, the battery tester assembly comprises a battery tester 2 and a wireless handle, wherein the wireless handle may, for example, be the wireless handle 1, 1', 1", or 1'" as described above. The battery tester 2 comprises a main body 22 and at least a pair of test leads (e.g., the test leads 21 or 21' as described above). The test leads can contact with the electrodes of a battery to measure parameters of the battery. The wireless signal transmitting/receiving means 11 of the wireless handle can establish wireless communication with the wireless signal transmitting/receiving module 221 inside the main body 22 to exchange information with the main body 22 through the wireless communication. The test leads can be detachably coupled onto the wireless handle to enable the operator to control the test leads to contact electrodes of the battery and measure relevant parameters.

While various aspects and examples have been disclosed herein, other aspects and examples will be apparent to those skilled in the art. The various aspects and examples disclosed herein are for purposes of illustration only and are not intended to be limiting, with the true scope and spirit being indicated by the following claims.

The embodiments of the invention in which an exclusive property or privilege is claimed are defined as follows:

1. A wireless handle for a battery tester, comprising:
    a mounting means for detachably mounting a test lead onto the wireless handle for connection to a battery to be tested;
    a wireless signal transmitting/receiving means configured to exchange information with a battery tester through wireless communication;
    an information input means;
    an information output means; and
    a signal processing and control means, wherein the wireless signal transmitting/receiving means, the information input means, and the information output means are coupled with the signal processing and control means.

2. The wireless handle of claim 1, wherein the wireless signal transmitting/receiving means transmits and/or receives radio frequency signals.

3. The wireless handle of claim 2, wherein the wireless signal transmitting/receiving means applies one or more of the following wireless communication technologies: Bluetooth, Wi-Fi, ZIGBEE, and Near Field Communication.

4. The wireless handle of claim 2, wherein the radio frequency signals have a frequency of 2.4 GHz.

5. The wireless handle of claim 1, wherein the wireless handle has a streamline-like shape, tapering off gradually from its proximal end to its distal end, or a rod-like shape, with a substantially rectangular or circular cross section.

6. The wireless handle of claim 1, wherein the mounting means is on the distal end of the wireless handle for detachably mounting the test lead onto the wireless handle.

7. The wireless handle of claim 1, wherein the mounting means is configured as a threaded hole having a side opening or a threaded flange having a side opening.

8. The wireless handle of claim 1, wherein the mounting means is configured as a clip for clamping the test lead of the battery tester.

9. The wireless handle of claim 1, wherein the wireless handle further comprises at least one wire accommodating means for detachably accommodating a wire extending from the test lead.

10. The wireless handle of claim 9, wherein the at least one wire accommodating means is configured as a groove extending along the peripheral surface of the wireless handle or a set of wire clips arranged on the outside of the wireless handle.

11. The wireless handle of claim 1, wherein the information output means includes a display.

12. The wireless handle of claim 11, wherein the display is positioned on a proximal end of the wireless handle.

13. The wireless handle of claim 12, wherein there is an angle between the display and the axial direction of the wireless handle.

14. The wireless handle of claim 13, wherein the angle between the display and the axial direction of the wireless handle is between 30° and 60°.

15. The wireless handle of claim 11, wherein the display is an LCD display, an LED display, an OLED display, a plasma display, or an E-ink display.

16. The wireless handle of claim 1, wherein the information output means includes a speaker.

17. The wireless handle of claim 1, wherein the information output means includes at least one indicator.

18. The wireless handle of claim 17, wherein the at least one indicator is arranged on or around a proximal end of the wireless handle.

19. The wireless handle of claim 17, wherein the at least one indicator indicates at least one state of the battery to be tested.

20. The wireless handle of claim 1, wherein the information input means includes at least one input key.

21. The wireless handle of claim 20, wherein the at least one input key is positioned around a proximal end of the wireless handle in such a manner that an operator of the wireless handle can operate the at least one input key with his fingers while gripping the wireless handle.

22. The wireless handle of claim 1, wherein the wireless handle further comprises a non-contact temperature sensor for testing the temperature of the battery to be tested.

23. The wireless handle of claim 22, wherein the non-contact temperature sensor is positioned on or around a distal end of the wireless handle.

24. The wireless handle of claim 1, wherein the wireless handle further comprises a power supply means.

25. The wireless handle of claim 24, wherein the power supply means is a battery placed inside the wireless handle.

26. The wireless handle of claim 24, wherein the wireless handle further comprises a light positioned on or around a distal end of the wireless handle, and the power supply means supplies power to the light.

27. A battery tester assembly comprising:
    a battery tester including a main body and at least a pair of test leads coupleable to the main body, wherein the main body comprises a wireless signal transmitting/receiving module; and
    a wireless handle comprising:
        a wireless signal transmitting/receiving module configured to exchange information with the battery tester through wireless communication;
        an information input;
        an information output; and
        a signal processor and controller coupled to the wireless signal transmitting/receiving module of the wireless handle, the information input, and the information output, wherein at least one of the test leads of the battery tester is detachably mounted onto the wireless handle, and wherein the wireless signal transmitting/receiving module of the wireless handle is configured to establish wireless communication with the wireless signal transmitting/receiving module of the battery tester to enable the wireless handle to exchange information with the battery tester through wireless communication.

28. The battery tester assembly of claim 27, wherein the test leads of the battery tester each include a tip for contacting an electrode of a battery to be tested and measuring parameters of the battery.

29. A wireless handle for a battery tester, comprising:
a wireless signal transmitter/receiver configured to wirelessly communicate information with a battery tester;
an input configured to receive information from an operator of the wireless handle;
an output configured to provide information to the operator of the wireless handle regarding at least one state of a battery to be tested by the battery tester;
a signal processor and controller, wherein the wireless signal transmitter/receiver, the input, and the output are coupled with the signal processor and controller; and
a mount configured to detachably mount a test lead of the battery tester onto the wireless handle.

30. The wireless handle of claim 29, further comprising at least one wire accommodating element that detachably accommodates a wire extending from the test lead.

* * * * *